(12) United States Patent
Kameoka et al.

(10) Patent No.: US 9,741,846 B2
(45) Date of Patent: Aug. 22, 2017

(54) SEMICONDUCTOR DEVICE

(71) Applicant: DENSO CORPORATION, Kariya, Aichi-pref. (JP)

(72) Inventors: Hiroshi Kameoka, Kariya (JP); Shigeki Takahashi, Kariya (JP); Akira Yamada, Kariya (JP); Atsushi Kasahara, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/039,564

(22) PCT Filed: Dec. 17, 2014

(86) PCT No.: PCT/JP2014/006295
§ 371 (c)(1),
(2) Date: May 26, 2016

(87) PCT Pub. No.: WO2015/093052
PCT Pub. Date: Jun. 25, 2015

(65) Prior Publication Data
US 2016/0351708 A1    Dec. 1, 2016

(30) Foreign Application Priority Data

Dec. 20, 2013 (JP) ................................ 2013-264295
Nov. 27, 2014 (JP) ................................ 2014-240158

(51) Int. Cl.
*H01L 29/66* (2006.01)
*H01L 29/78* (2006.01)
(Continued)

(52) U.S. Cl.
CPC .......... *H01L 29/7824* (2013.01); *H01L 21/84* (2013.01); *H01L 27/0922* (2013.01);
(Continued)

(58) Field of Classification Search
CPC ..................... H01L 29/66568; H01L 29/735
See application file for complete search history.

(56) References Cited

U.S. PATENT DOCUMENTS 6,064,086 A    5/2000 Nakagawa et al.
6,133,607 A   10/2000 Funaki et al.
(Continued)

FOREIGN PATENT DOCUMENTS

JP    H06-310594 A    11/1994
JP    2006-005175 A    1/2006
(Continued)

OTHER PUBLICATIONS

Masaharu Yamaji et al., "800 V Guaranteed HVIC Technology", Fuji Electric Journal, vol. 83, No. 6, pp. 398-404, Nov. 2010. (and partial English translation).

*Primary Examiner* — Jae Lee
(74) *Attorney, Agent, or Firm* — Posz Law Group, PLC

(57) ABSTRACT

A semiconductor device includes a lateral transistor having: a semiconductor substrate including a drift layer; a first impurity layer in the drift layer; a channel layer in the drift layer; a second impurity layer in the channel layer; a separation insulation film on the drift layer between the channel layer and the first impurity layer; a gate insulation film on a channel region between the second impurity layer and the drift layer connected with the separation insulation film; a gate electrode on the gate insulation film and the separation insulation film; a first electrode connected with the first impurity layer; a second electrode connected with the second impurity layer and the channel layer; and a field plate on the separation insulation film between the gate electrode and the first electrode and connected with the first electrode. The field plate is larger than the gate electrode in a current direction.

7 Claims, 11 Drawing Sheets

(51) Int. Cl.
*H01L 21/84* (2006.01)
*H01L 27/092* (2006.01)
*H01L 27/12* (2006.01)
*H01L 29/40* (2006.01)
*H01L 29/06* (2006.01)
*H01L 29/08* (2006.01)
*H01L 29/10* (2006.01)
*H01L 29/423* (2006.01)

(52) U.S. Cl.
CPC ...... *H01L 27/1203* (2013.01); *H01L 29/0692* (2013.01); *H01L 29/0878* (2013.01); *H01L 29/1095* (2013.01); *H01L 29/402* (2013.01); *H01L 29/66681* (2013.01); *H01L 29/42368* (2013.01)

(56) References Cited

U.S. PATENT DOCUMENTS 6,191,453 B1 * 2/2001 Petruzzello ......... H01L 29/7394
257/350
2001/0048122 A1 12/2001 Tada et al.
2002/0145172 A1 10/2002 Fujishima et al.
2003/0071320 A1 * 4/2003 Kocon ................. H01L 29/404
257/487
2006/0049406 A1 * 3/2006 Amaratunga ........... H01L 21/84
257/66
2011/0133269 A1 6/2011 Yamaji
2012/0119318 A1 5/2012 Tokura et al.
2013/0020632 A1 * 1/2013 Disney ................. H01L 29/402
257/328
2013/0093010 A1 4/2013 Huang et al.

FOREIGN PATENT DOCUMENTS

| | | |
|---|---|---|
| JP | 4082014 B2 | 4/2008 |
| JP | 2008-153495 A | 7/2008 |
| JP | 4894097 B2 | 3/2012 |
| JP | 4910292 B2 | 4/2012 |
| JP | 2012-178410 A | 9/2012 |

* cited by examiner

SEMICONDUCTOR DEVICE

CROSS REFERENCE TO RELATED APPLICATIONS

This application is the U.S. national phase of International Patent Application No. PCT/JP2014/006295 filed on Dec. 17, 2014, and is based on Japanese Patent Applications No. 2013-264295 filed on Dec. 20, 2013, and No. 2014-240158 filed on Nov. 27, 2014, the disclosures of which are incorporated herein by reference.

TECHNICAL FIELD

The present disclosure relates to a semiconductor device including a lateral semiconductor switching element.

BACKGROUND ART

Patent Literature 1 proposes a lateral MOSFET having high breakdown voltage and high reliability. This lateral MOSFET includes a conductive field plate disposed on a thick insulation film on both the source side and drain side with a gate interposed therebetween. The field plate is made of Poly-Si, for example, and has a floating potential not electrically connected with other electrodes or the like.

According to the structure including this field plate, the potential of the field plate is set to an intermediate potential between potentials of a gate electrode and a drain layer when the potential difference between the gate electrode and the drain layer increases. Accordingly, each of the potential difference between the gate electrode and the field plate, and the potential difference between the field plate and the drain layer is kept smaller than the potential difference between the gate electrode and the drain electrode, in which condition electric field concentration below the thick insulation film decreases. As a result, the breakdown voltage increases.

There is also a structure which provides a resistant field plate between the high potential side and the low potential side of a lateral IGBT to decrease a potential in the direction from the high potential side to the low potential side. This field plate has a spiral shape, for example. One and the other ends of the field plate are connected with the high potential portion and the low potential portion, respectively. The structure including this field plate produces a gradual potential change even in a potential distribution below the field plate, thereby reducing electric field concentration for prevention of breakdown caused by electric field concentration, and reduction of a loss produced at the time of switching.

However, when the field plate has a floating potential as in Patent Literature 1, charges are easily produced within Poly-Si constituting the field plate, or the interface between the insulation film and Poly-Si. These charges cause on-resistance fluctuations. According to simulation conducted by using an estimated model of a lateral MOSFET illustrated in FIG. 11, it has been confirmed that movable ions contained in an interlayer insulation film of a BPSG (Borophospho silicate glass) film 1 are accumulated in an LOCOS oxide film 32, and affect a current path. Specifically, as illustrated in FIG. 11, the current path is formed at a position deeper than the interface between the LOCOS oxide film J2 and a drift layer J3 by negative charges of the movable ions accumulated in the LOCOS oxide film J2. In this condition, sufficient reduction of on-resistance fluctuations is difficult to achieve.

On the other hand, in case of the structure connecting one and the other ends of the field plate with the high potential portion and the low potential portion, respectively, a current of 1 µA or higher flows in the field plate based on the potential difference between the ends of the field plate. As a result, a current loss increases.

PRIOR ART LITERATURES

Patent Literature

Patent Literature 1: JP-2012-178410-A

SUMMARY OF INVENTION

It is an object of the present disclosure to provide a semiconductor device which includes a semiconductor switching element containing a field plate capable of reducing on-resistance fluctuations and a current loss.

According to an aspect of the present disclosure, a semiconductor device includes a lateral transistor, which has: a semiconductor substrate including a drift layer having a first conductivity type; a first impurity layer having the first conductivity type or a second conductivity type and arranged in a surface portion of the drift layer; a channel layer having the second conductivity type and arranged in another surface portion of the drift layer; a second impurity layer having the first conductivity type, arranged in a surface portion of the channel layer, and surrounded by the channel layer; a separation insulation film arranged on the drift layer between the channel layer and the first impurity layer; a gate insulation film arranged on a surface of a channel region of the channel layer and connected with the separation insulation film, the channel region being arranged in another surface portion of the channel layer sandwiched between the second impurity layer and the drift layer; a gate electrode arranged on a surface of the gate insulation film and extending from the gate insulation film to the separation insulation film; a first electrode electrically connected with the first impurity layer; a second electrode electrically connected with the second impurity layer and the channel layer; and a field plate arranged on the separation insulation film between the gate electrode and the first electrode and electrically connected with the first electrode to be fixed to a potential of the first electrode. A size of the field plate is larger than a size of the gate electrode in a direction of current flowing between the first electrode and the second electrode.

According to the above structure, the field plate is disposed between the gate electrode and the first electrode on the separation insulation film, and is electrically connected with the first electrode to fix the field plate to a potential of the first electrode. In this case, generation of negative charges within the field plate is avoidable by extraction of negatively charged movable ions within the field plate through wiring or the like connected to the first electrode. This structure therefore achieves reduction of an Influence exerted on the surface portion of the drift layer located below the separation insulation film, i.e., a current path between the first impurity layer and the second impurity layer, and thereby achieves reduction of on-resistance fluctuations.

Moreover, according to this structure, the field plate fixed to the potential of the first electrode does not produce a potential difference between both ends of the field plate, and thus generation of current flow produced by a potential difference between both ends of the field plate is prevented. Accordingly, reduction of a current loss is realizable.

The semiconductor device including the foregoing field plate in the semiconductor switching element therefore achieves reduction of on-resistance fluctuations and a current loss.

Furthermore, the size of the field plate is larger than the size of the gate electrode in the direction of current flow between the first electrode and the second electrode.

More effective reduction of on-resistance fluctuations is achievable when the size of the field plate is larger than the size of the gate electrode, rather than when the size of the gate electrode is larger than the size of the field plate. Accordingly, further reduction of on-resistance fluctuations is realizable.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, embodiments according to the present disclosure will be described with reference to the drawings. Identical or similar parts in the respective embodiments presented below are given identical reference numbers.

First Embodiment

Figure 1:
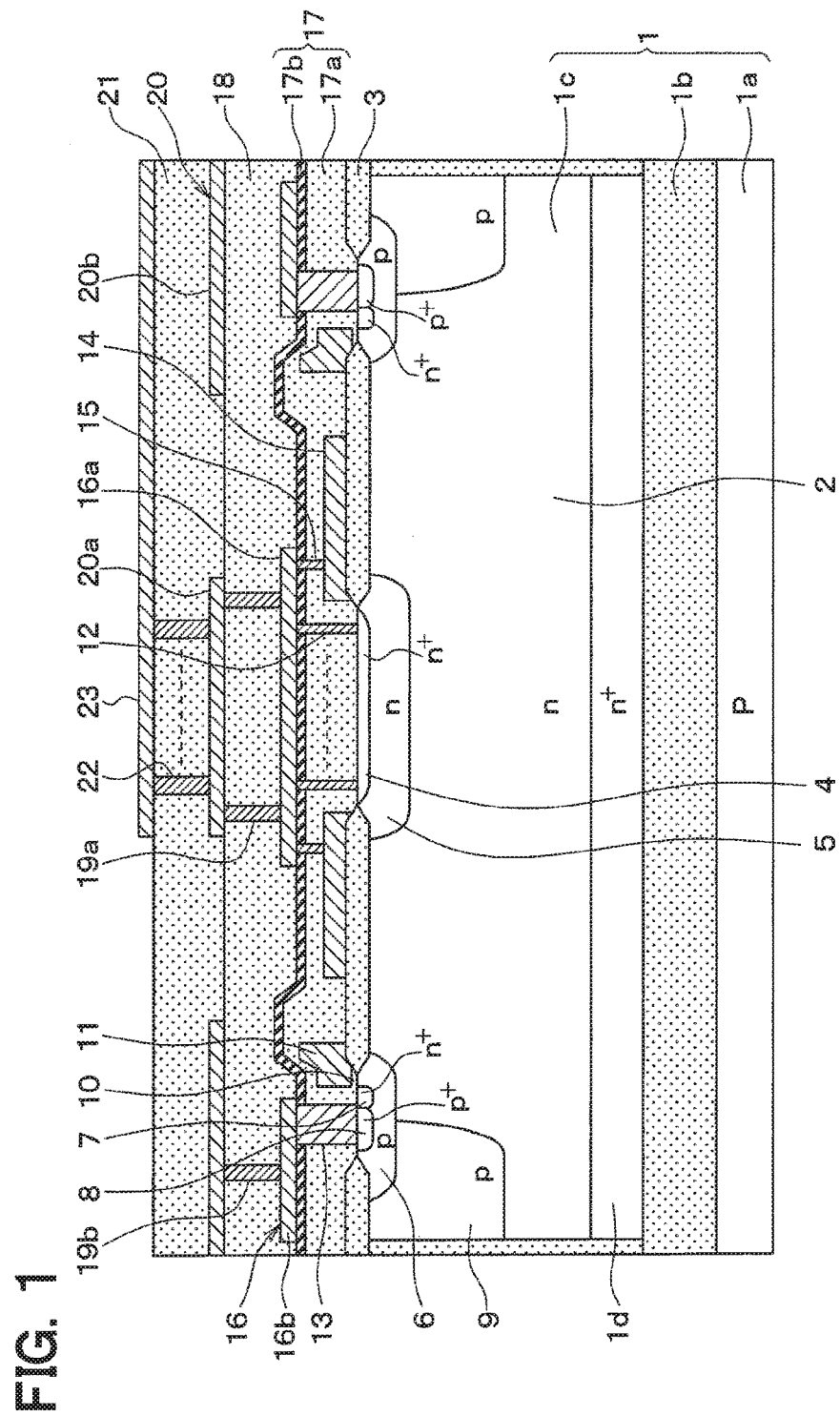
FIG. 1 is a cross-sectional view of a semiconductor device including a lateral MOSFET according to a first embodiment of the present disclosure.
Figure 2:
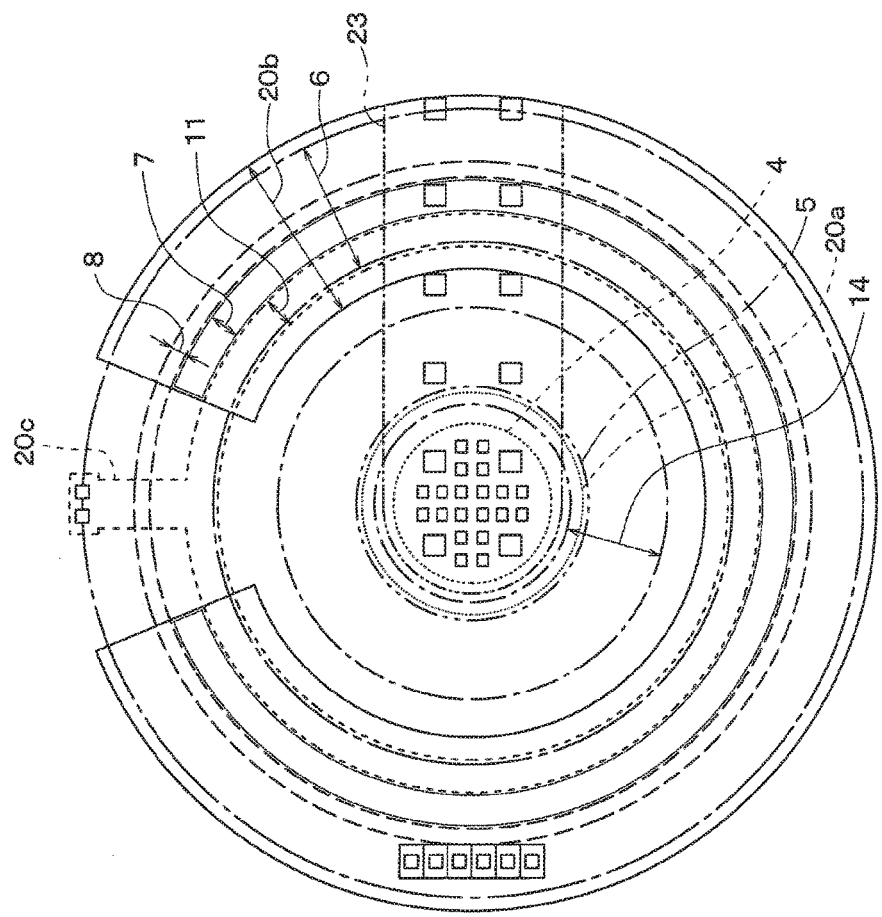
FIG. 2 illustrates a layout of an upper surface of the semiconductor device including the lateral MOSFET illustrated in FIG. 1.

A semiconductor device including a lateral MOSFET according to a first embodiment of the present disclosure will be described with reference to FIGS. 1 and 2. Each of FIGS. 1 and 2 illustrates one cell of the lateral MOSFET. However, a semiconductor device used in an actual situation is constituted by arrangement of a plurality of the illustrated cells, and other elements such as a CMOS as necessary.

As illustrated in FIG. 1, the lateral MOSFET of this embodiment is constituted by a SOI substrate 1 corresponding to a semiconductor substrate. The SOI substrate 1 includes an active layer 1c formed on a support substrate 1a with a buried oxide film (BOX: Buried Oxide) 1b, corresponding to a buried insulation film, interposed between the active layer 1c and the support substrate 1a. The active layer 1c is made of n type silicon. The support substrate 1a is made of p type silicon or the like. According to this embodiment, an $n^+$ type buried high-concentration layer 1d is further formed on the active layer 1c on the buried oxide film 1b side to constitute the SOI substrate 1. However, the $n^+$ type buried high-concentration layer 1d may be eliminated. The active layer 1c of the SOI substrate 1 functions as an $n^-$ type drift layer 2. Portions constituting the lateral MOSFET are formed in a surface layer portion of the $n^-$ type drift layer 2.

An LOCOS oxide film 3 corresponding to a separation insulation film is formed on the surface of the $n^-$ type drift layer 2. The LOCOS oxide film 3 separates the respective portions constituting the lateral MOSFET. As illustrated in FIG. 2, an $n^+$ type drain region 4 having a circular upper surface is formed in the surface layer portion of the $n^-$ type drift layer 2 in a region where the LOCOS oxide film 3 is not formed. The circumference of the $n^+$ type drain region 4 is surrounded by an n type buffer layer (n type well layer) 5 having a higher impurity concentration than that of the $n^-$ type drift layer 2.

There are further formed a channel p well layer 6, an $n^+$ type source region 7, a $p^+$ type contact layer 8, and a $p^+$ type deep layer 9 around the $n^+$ type drain region 4 in the surface layer portion of the $n^-$ type drift layer 2 in an region where the LOCOS oxide film 3 is not formed.

The channel p well layer 6 is a portion on the surface of which a channel region is formed. As illustrated in FIG. 2, the channel p well layer 6 is concentrically disposed to surround the entire circumference of the $n^+$ type drain region 4 with the center located at the $n^+$ type drain region 4.

The $n^+$ type source region 7 is disposed in a surface layer portion of the channel p well layer 6 at a position away from the $n^+$ type drain region 4. The $n^+$ type source region 7 is terminated inside the end position of the channel p well layer 6. As illustrated in FIG. 2, the $n^+$ type source region 7 is also concentrically disposed to surround the substantially entire circumference of the $n^+$ type drain region 4.

The $p^+$ type contact layer 8 is provided to fix the channel p well layer 6 to a source potential, and has a higher impurity concentration than that of the channel p well layer 6. As illustrated in FIG. 2, the $p^+$ type contact layer 8 is also concentrically disposed to surround the entire circumference of the $n^+$ type drain region 4 with the center located at the $n^+$ type drain region 4.

The $p^+$ type deep layer 9 has a function of reducing a voltage drop produced by Hall current flowing from the drain to the source via the surface. The $p^+$ type deep layer 9 is also concentrically disposed to surround the entire circumference of the $n^+$ type drain region 4 with the center located at the $n^+$ type drain region 4. The $p^+$ type deep layer 9 decreases operation of a parasitic npn transistor constituted by the $n^+$ type source region 7, the channel p well layer 6, and the $n^-$ type drift layer 2, thereby improving turn-off time.

A gate electrode 11 made of doped Poly-Si is disposed on the surface of the channel p well layer 6 with a gate insulation film 10 interposed between the gate electrode and the channel p well layer 6. A channel region is formed on a surface portion of the channel p well layer 6 when gate voltage is applied to the gate electrode 11. Specifically, the gate insulation film 10 is formed on the channel region and connected to the LOCOS oxide film 3, while the gate electrode 1 is extended from the gate insulation film 10 to the LOCOS oxide film 3.

Drain electrodes 12 corresponding to a first electrode and electrically connected with the $n^+$ type drain region 4 are formed on the surface of the $n^+$ type drain region 4. The drain electrodes 12 are divided into a plurality of pieces arranged on the $n^+$ type drain region 4. According to this embodiment, the drain electrodes 12 are constituted by a part of a 1st Al layer 16 described below. Broken lines in FIG. 1 indicate the plurality of pieces of the drain electrodes 12 in a simplified shape.

A source electrode 13 corresponding to a second electrode and electrically connected with the $n^+$ type source region 7 and the $p^+$ type contact layer 8 is formed on the surfaces of the $n^+$ type source region 7 and the $p^+$ type contact layer 8. The components such as the gate electrode 11 and the source electrode 13 are so disposed as to surround the drain electrodes 12, and therefore these components like the gate electrode 11 and the source electrode 13 are located on both sides of the drain electrodes 12 as viewed in the cross section illustrated in FIG. 1. However, in a practical situation, the gate electrode 11 and the source electrode 13 disposed on both sides of the drain electrodes 12 are connected with each other in a different cross section.

A field plate 14 constituted by extended doped Poly-Si is formed on the surface of the LOCOS oxide film 3 disposed on the $n^-$ type drain region 4 between the drain and gate, i.e., between the channel p well layer 6 and the $n^+$ type drain region 4. The field plate 14 is electrically connected with the drain electrodes 12 via contact wiring 15 and a drain wiring layer 16a constituted by a part of the 1st Al layer 16 corresponding to a first metal wiring layer. Accordingly, the field plate 14 is fixed to a drain potential. According to this embodiment, the size of the field plate 14 is larger than the size of the gate electrode 11 in a radial direction around the cell center (drain center).

A first interlayer insulation film 17 is provided on the surfaces of the components such as the gate electrode 11, the field plate 14, and the LOCOS oxide film 3. The interlayer insulation film 17 may be constituted by a single layer film. However, the interlayer insulation film 17 according to this embodiment is constituted by a laminated film of a BPSG film 17a and a silicon nitride film (SiN film) 17b. In case of a single layer film, the interlayer insulation film 17 is generally constituted only by the BPSG film 17a. In this case, however, the silicon nitride film 17b functioning as a moisture proof film is laminated on the BPSG film 17a to prevent entrance of moisture toward the element side.

Contact holes are formed at respective positions of the first interlayer insulation film 17. Connection between the drain electrodes 12 and the $n^+$ type drain region 4, connection between the source electrode 13 and the layers of the $n^+$ type source region 7 and the $p^+$ type contact layer 8, and connection between the field plate 14 and the contact wiring 15 are made via the contact holes. While not shown in FIG. 1, connection between the gate electrode 11 and gate wiring formed in a different cross section is also made via the contact holes.

The 1st Al layer 16 patterned in the surface of the first interlayer insulation film 17 constitutes the drain wiring 16a and source wiring 16b. The drain electrodes 12 and the contact wiring 15 are connected with the drain wiring layer 16a to make connection between the field plate 14 and the drain electrodes 12. The source electrode 13 is connected with the source wiring layer 16b.

A second interlayer insulation film 18 made of TEOS (TetraEthOxySilane) or the like is provided on the surface of the first interlayer insulation film 17 including the surface of the 1st Al layer 16. Contact holes are also formed at respective positions of the second interlayer insulation film 18. Drain wiring plugs 19a and source wiring plugs 19b are disposed within the contact holes. A 2nd Al layer 20 corresponding to a second metal wiring layer is patterned in the surface of the second interlayer insulation film 18. Each of the drain wiring plugs 19a is connected with a drain wiring layer 20a, while each of the source wiring plugs 19b is connected with a source wiring layer 20b. In this case, the drain wiring plugs 19a and the source wiring plugs 19b are provided separately from the 2nd Al layer 20. However, the drain wiring plugs 19a and the source wiring plugs 19b may be constituted by the 2nd Al layer 20.

As illustrated in FIG. 2, the drain wiring layer 20a is disposed at a central portion of the cell, and has a circular shape. The source wiring layer 20b surrounds the drain wiring layer 20a with the center located at the drain wiring layer 20a. As illustrated in FIG. 2, the source wiring layer 20b is connected with the outside on the left side in FIG. 2. A notch is formed in a part of the source wiring layer 20b. Gate extension wiring 20c connected with the gate electrode 11 is extended through the notch toward the outside to connect with the outside.

A third interlayer insulation film 21 made of TEOS (TetraEthOxySilane) or the like is further formed on the surface of the second interlayer insulation film 18 including the surface of the 2nd Al layer 20. Contact holes are also formed at respective positions of the third interlayer insulation film 21. Drain wiring plugs 22 are disposed within the contact holes. A 3nd Al layer is patterned in the surface of the third interlayer insulation film 21 to form a drain wiring layer 23. The drain wiring layer 23 is connected with the drain wiring plugs 22. As illustrated in FIG. 2, the drain wiring layer 23 is extended toward the outside of the cell in the direction opposite to the extension direction of a source wiring 21b (right side in the figure) to connect with the outside.

The semiconductor device including the lateral MOSFET according to this embodiment is configured as described above. The lateral MOSFET included in the semiconductor device thus configured forms an inverting channel region in a surface layer portion of the channel p well layer 6 disposed below the gate electrode 11 when a desired gate voltage is applied to the gate electrode 11. Electric continuity between the source electrode 13 and the drain electrodes 12 is made via the channel region thus formed. As a result, MOSFET operation for supplying current between the source and drain starts.

According to the lateral MOSFET of this embodiment thus configured, the field plate 14 is disposed on the LOCOS oxide film 3 between the gate electrode 11 and the drain electrodes 12, and electrically connected with the drain electrodes 12. This structure fixes the field plate 14 to a drain potential. Accordingly, negatively charged movable ions within the field plate 14 are extractable via the drain wiring layer 16a and the like to prevent generation of negative charges within the field plate 14. As a result, an influence exerted on the surface portion of the $n^-$ type drift layer 2 located below the LOCOS oxide film 3, i.e., the current path between the source and the drain decreases, and therefore on-resistance fluctuations become smaller.

In addition, the field plate 14 fixed to the drain potential does not produce a potential difference between both ends of the field plate 14. This structure prevents flow of current caused by a potential difference between both ends of the field plate 14, and thus realizes reduction of a current loss.

Accordingly, the semiconductor device including the field plate 14 in the semiconductor switching element achieves reduction of on-resistance fluctuations and a current loss.

Figure 3:
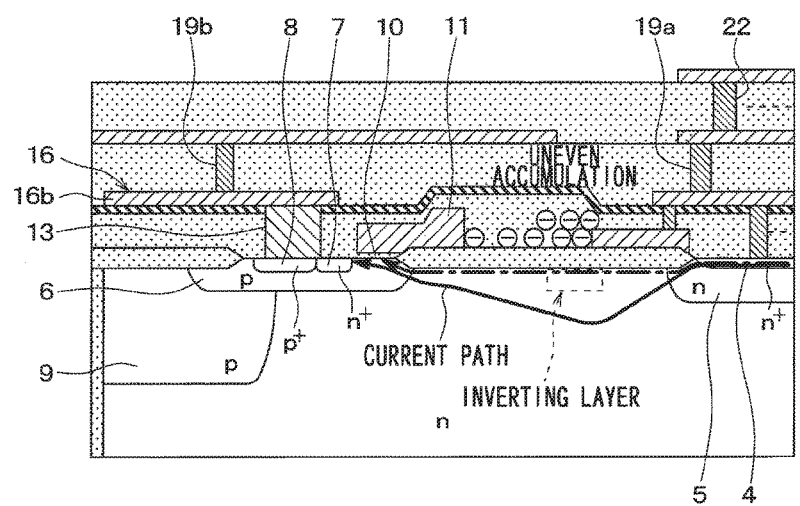
FIG. 3 is a cross-sectional view illustrating an effect of movable ions produced when high voltage is applied to drain electrodes 12.

There is an idea that the field plate 14 is electrically connected not with the drain electrodes 12, but with the gate electrode 11 to cover the surface of the LOCOS oxide film 3 at a gate potential. In this case, however, movable ions are more accumulated on the drain side when high voltage is applied to the drain electrodes 12 as illustrated in FIG. 3. In this case, an Inverting layer is formed in the surface layer portion of the n-type drift layer 2 by the influence of negative charges of the movable ions, and affects the current path. Specifically, the current path needs to be formed on the $n^-$ type drift layer 2 in the surface portion in contact with the LOCOS oxide film 3 as indicated by a long dashed short dashed arrow in FIG. 3. However, the current path in this case is formed at a relatively deep position of the $n^-$ type drift layer 2 while bypassing the inverting layer formed by the influence of negative ions of the movable ions as indicated by a broken arrow in FIG. 3.

For overcoming this problem, the field plate 14 is electrically connected with the drain electrodes 12 to extract the movable ions on the drain electrode 12 side. This structure reduces on-resistance fluctuations more effectively than the structure which electrically connects the field plate 14 to the gate electrode 11.

In particular, the source wiring layer 20*b* according to this embodiment is configured to surround the drain wiring layer 20*a* with the center located at the drain wiring layer 20*a*. In this case, current flows in a smaller region on the drain side than on the source side, and therefore current density becomes larger on the drain side than on the source side. As a result, differences in the on-resistance fluctuation reduction effect arise with variations of the current density in accordance with the position of the field plate 14. When movable ions are extracted on the drain electrode 12 side, more effective on-resistance fluctuation reduction is achievable.

The on-resistance fluctuation reduction effect is variable in accordance with the size relationship between the field plate 14 and the gate electrode 11, moisture proofing performance, and other factors. According to this embodiment, the size of the field plate 14 is larger than the size of the gate electrode 11 in the radial direction around the cell center. Moreover, the silicon nitride film 17*b* functioning as a moisture proof film is provided on the first interlayer insulation film 17.

Figure 4:
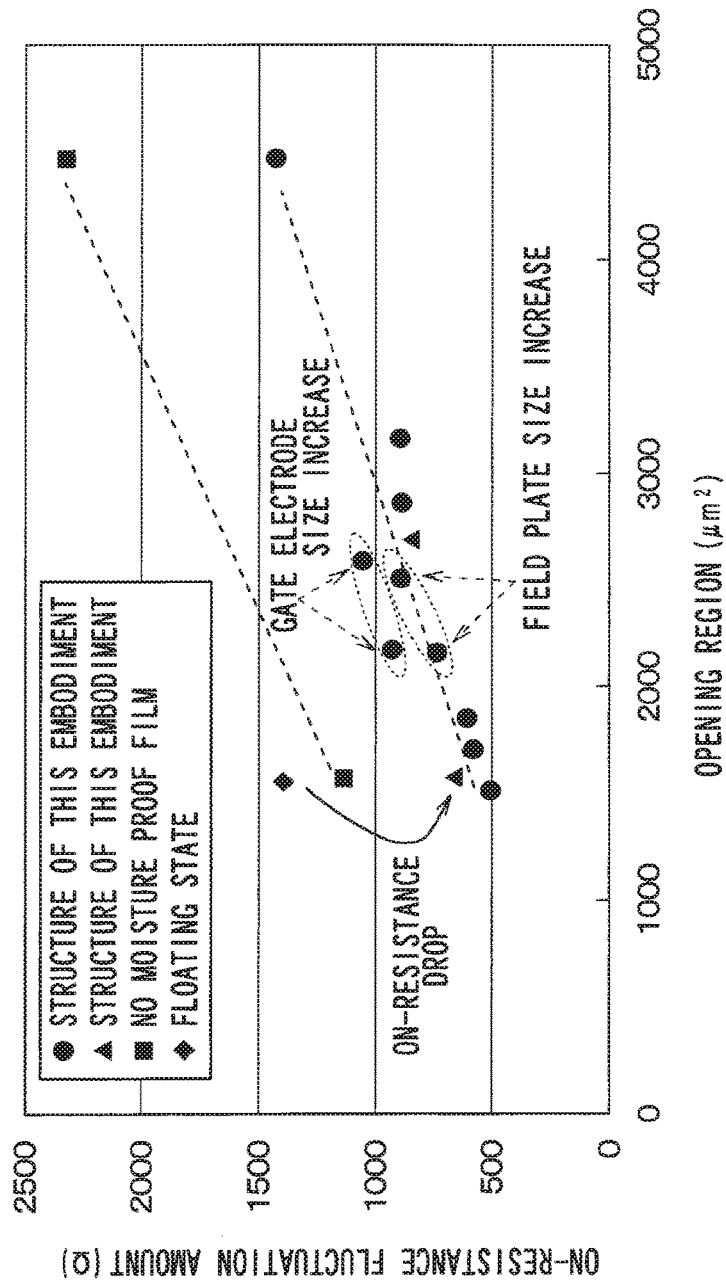
FIG. 4 is a view showing results of respective experiments performed while varying conditions to investigate an on-resistance fluctuation reduction effect.
Figure 5:
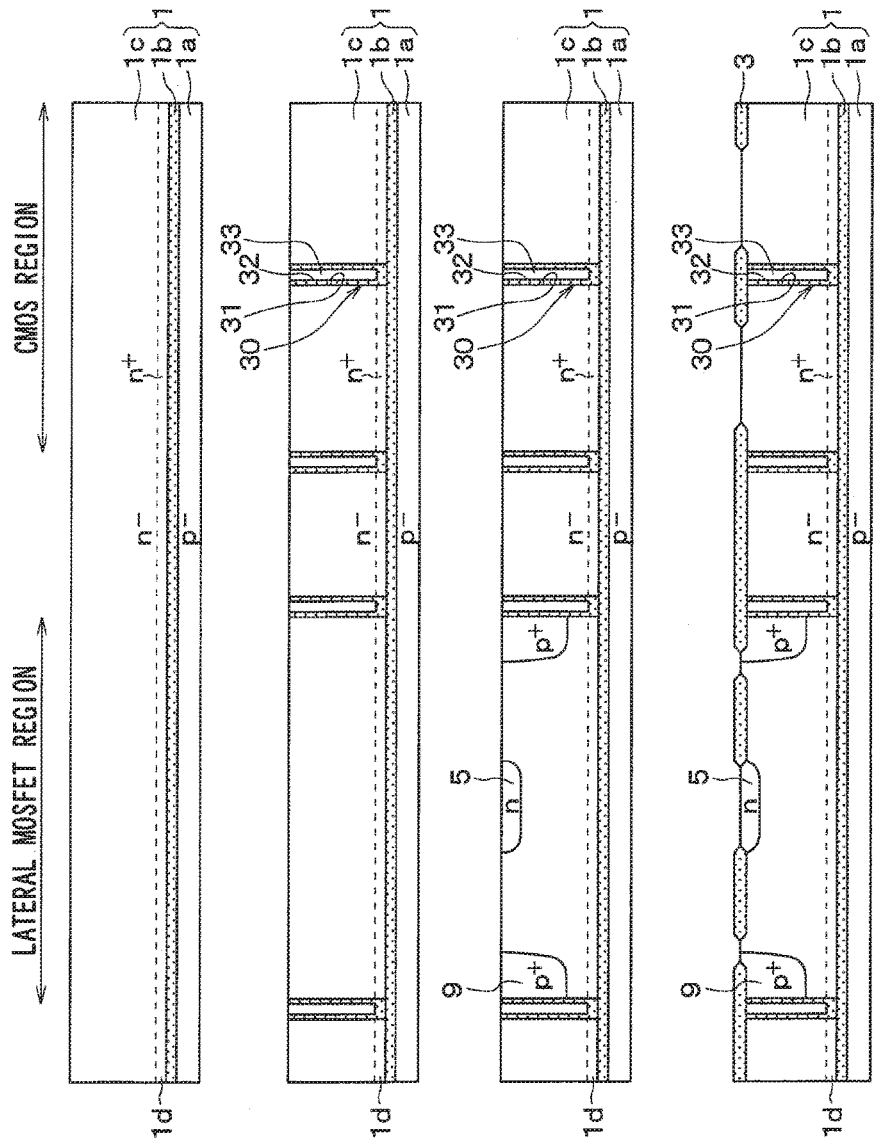
FIGS. 5A to 5D are cross-sectional views illustrating manufacturing steps of the semiconductor device including the lateral MOSFET illustrated in FIG. 1.
Figure 6:
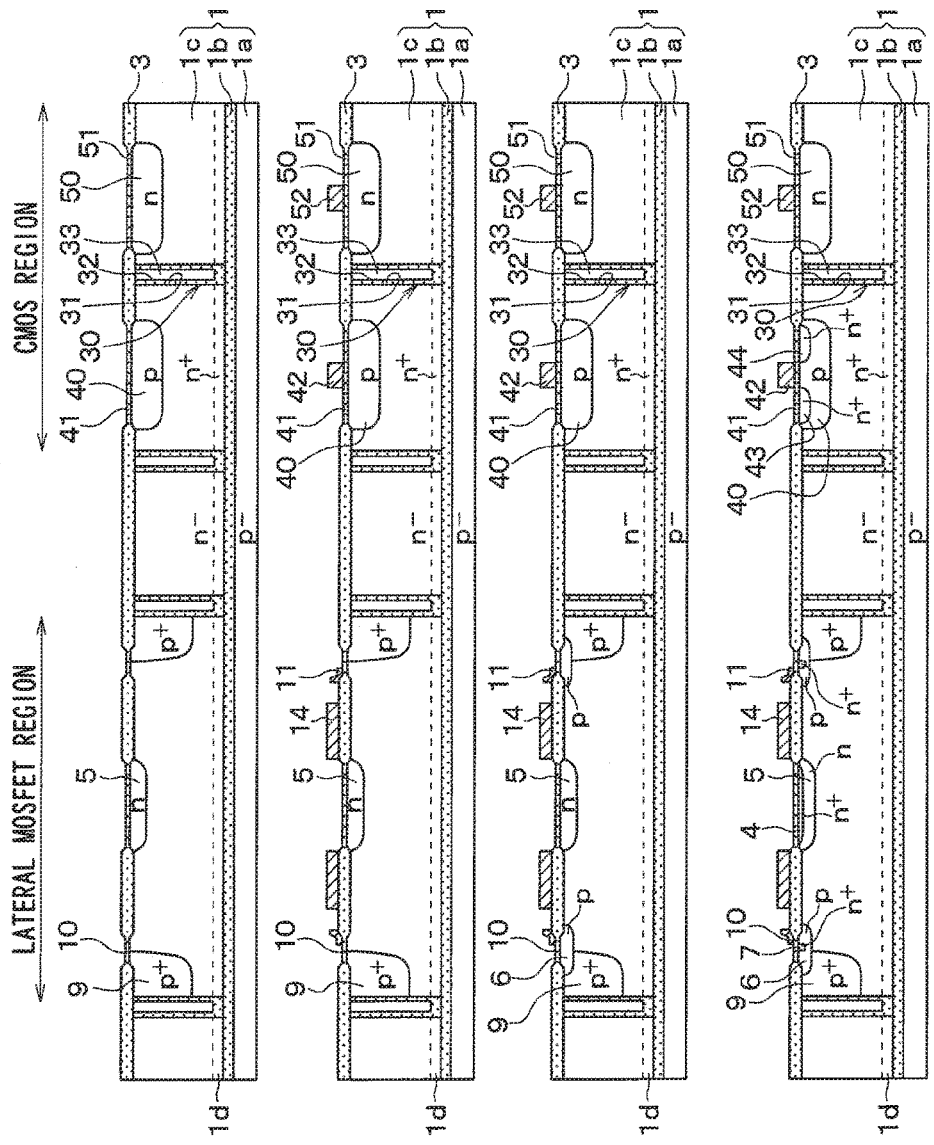
FIGS. 6A to 6D are cross-sectional views illustrating manufacturing steps of the semiconductor device including the lateral MOSFET continuing from FIG. 5D.
Figure 7:
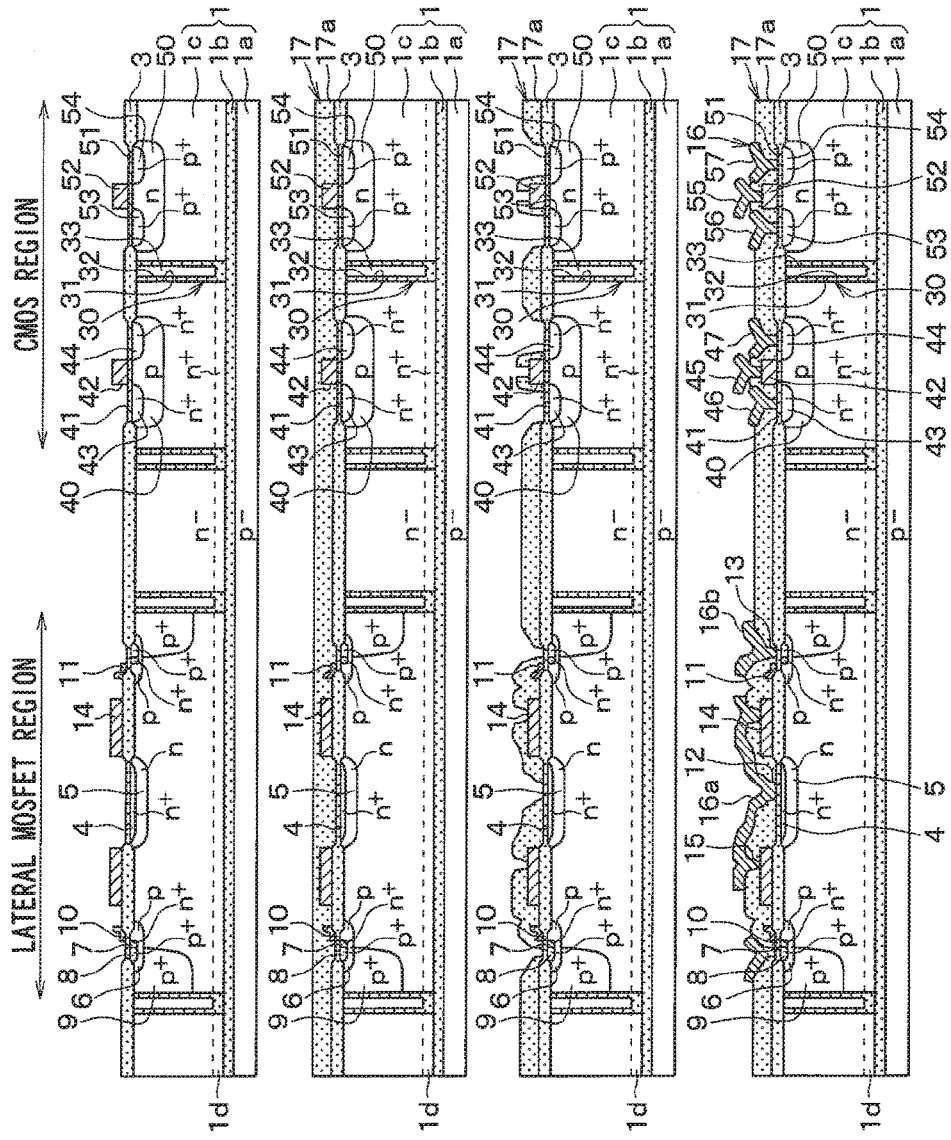
FIGS. 7A to 7D are cross-sectional views illustrating manufacturing steps of the semiconductor device including the lateral MOSFET continuing from FIG. 6D.

This point is further detailed with reference to FIG. 4. FIG. 4 shows results of respective experiments performed while changing conditions to investigate the on-resistance fluctuation reduction effect. Specifically, experiments were performed while changing the opening region between the field plate 14 and the gate electrode 11, the sizes of the field plate 14 and the gate electrode 11 in the radial direction around the cell center, and the connection manner of the field plate 14. In addition, experiments were performed for a structure including only the BPSG film 17*a* in the first interlayer insulation film 17.

As can be seen from FIG. 4, an on-resistance fluctuation amount increases as the opening region between the field plate 14 and the gate electrode 11 becomes larger. Accordingly, on-resistance fluctuations decrease when the distance between the field plate 14 and the gate electrode 11 is reduced as much as possible for reduction of the opening region therebetween.

On the other hand, according to an experiment which varies the sizes of the field plate 14 and the gate electrode 11 in the radial direction around the cell center while maintaining the opening region between the field plate 14 and the gate electrode 11 at a substantially equivalent region, it has been found that on-resistance fluctuations decrease with increase in the size of the field plate 14. Specifically, on-resistance fluctuations become smaller in a structure which decreases the size of the gate electrode 11 while increasing the size of the field plate 14, in comparison with a structure which decreases the size of field plate 14 while increasing the size of the gate electrode 11. Accordingly, on-resistance fluctuations further decrease when the size of the field plate 14 is larger than the size of the gate electrode 11 in the radial direction around the cell center.

The on-resistance fluctuation amount increases when the field plate 14 is in a floating state, rather than when the field plate 14 is not in a floating state. It is therefore understood that on-resistance fluctuations decrease when the field plate 14 is fixed to the drain potential.

It can be seen from the results that moisture enters the element side when the first interlayer insulation film 17 does not include the silicon nitride film 17*b* functioning as a moisture proof film. Movable ions generated by the moisture produce on-resistance fluctuations. According to this embodiment, however, the moisture proof function of the silicon nitride film 17*b* prevents entrance of movable ions from the outside, and contributes to further reduction of on-resistance fluctuations.

A manufacturing method of the semiconductor device including the lateral MOSFET according to this embodiment will be described with reference to FIGS. 5A to 7D. Discussed herein by way of example is a structure manufacturing both the lateral MOSFET illustrated in FIG. 1 and a CMOS.

[Step in FIG. 5A]

The SOI substrate 1 is initially prepared. This substrate includes the active layer 1*c* made of n type silicon and formed on the support substrate 1*a* with the buried oxide film 1*b* interposed between the active layer 1*c* and the support substrate 1*a*. The support substrate 1*a* is made of p type silicon or the like. The SOI substrate 1 further includes the $n^+$ type buried high-concentration layer 1*d* formed on the active layer 1*c* on the buried oxide film 1*b* side.

[Step in FIG. 5B]

Trench separation structures 30 are formed in the active layer 1*c* by an ordinary trench separating step to separate respective elements constituting the lateral MOSFET and the CMOS. For example, trenches 31 for element separation are formed by using a not-shown etching mask. Thermal oxide films 32 are formed on the inner wall surfaces of the trenches 31 by thermal oxidation. Poly-Si layers 33 are formed in the trenches 31 to fill the inside of the trenches 31. The surface is flattened by CMP (Chemical Mechanical Polishing) or other methods. The trench separation structures 30 thus produced separate a lateral MOSFET region from a CMOS region, and also separate an NchMOSFET region in the CMOS region from a PchMOSFET region in the CMOS region.

[Step in FIG. 5C]

A not-shown mask opened in the region of the n type buffer layer 5 is positioned, and then ions of n type impurities (such as phosphorus) are implanted. After removal of the mask used for ion implantation of the n type impurities, a not-shown mask opened in the region of the p+ type deep layer 9 is further positioned. In this condition, ions of p type impurities (such as boron) are implanted. The implanted impurities are thermally diffused by heat treatment to form the n type buffer layer 5 and the p+ type deep layer 9.

[Step in FIG. 5D]

An LOCOS oxidation step is performed. For example, an oxide film and a nitride film are sequentially formed throughout the substrate surface, and then an opening is formed in the LOCOS oxide film region of the nitride film. After thermal oxidation, a silicon oxide film and the oxide film in the region other than the region of the LOCOS oxide film are removed. As a result, the LOCOS oxide film 3 is produced.

[Step in FIG. 6A]

A not-shown mask opened in the NchMOSFET region of the CMOS region is positioned, and then ions of p type impurities are implanted. After removal of the mask for ion implantation of the p type impurities, a not-shown mask opened in the PchMOSFET region is further positioned. In this condition, ions of n type impurities are implanted. The implanted impurities are thermally diffused by heat treatment to form a p type well layer 40 and an n type well layer 50.

Thermal oxidation is performed to form the gate insulation film 10 in the lateral MOSFET region, and further form a gate oxide film 41 in the NchMOSFET region and a gate oxide film 51 in the PchMOSFET region.

[Step in FIG. 6B]

A Poly-Si layer is formed and then patterned to simultaneously form the gate electrode 11 and the field plate 14 in the lateral MOSFET region, and form a gate electrode 42 in the NchMOSFET region, and a gate electrode 52 in the PchMOSFET region.

[Step in FIG. 6C]

A not-shown mask opened in the region of the channel p type well layer 6 is formed, and then ions of p type impurities are implanted. The Implanted p type impurities are thermally diffused by heat treatment to form the channel p type well layer 6.

[Step in FIG. 6D]

A not-shown mask opened in the regions of n+ type impurity layers in the lateral MOSFET region and the NchMOSFET region is formed, and then ions of n type impurities are implanted. The implanted n type impurities are thermal diffused by heat treatment to form the n+ type source region 7 and the n+ type drain region 4 in the lateral MOSFET region, and to form an n+ type source region 43 and an n+ drain region 44 in the NchMOSFET region.

[Step in FIG. 7A]

A not-shown mask opened in regions of p+ type impurity layers in the lateral MOSFET region and the PchMOSFET region is formed, and then ions of p type impurities are implanted. The implanted p type impurities are thermal diffused by heat treatment to form the p+ type contact layer 8 in the lateral MOSFET region, and to form a p+ type source region 53 and a p+ drain region 54 in the PchMOSFET region.

[Step in FIG. 7B]

The BPSG film 17a is deposited throughout the surface of the substrate. While not shown in FIG. 7B, the silicon nitride film 17b is also deposited on the surface of the BPSG film 17a to form the first interlayer insulation film 17.

[Step in FIG. 7C]

A not-shown mask opened at positions of the contact holes is formed, and then the first interlayer insulation film 17 is etched to form the contact holes.

[Step in FIG. 7D]

The 1st Al layer 16 is formed and then patterned. As a result, the drain electrodes 12, the source electrode 13, the contact wiring 15, the drain wiring layer 16a, and the source wiring layer 16b are formed in the lateral MOSFET region. On the other hand, gate wiring 45, a source electrode 46, and a drain electrode 47 are formed in the NchMOSFET region, while gate wiring 55, a source electrode 56, and a drain electrode 57 are formed in the PchMOSFET region.

While not shown in the figure, there are further performed a step for forming the second interlayer insulation film 18, a step for forming the 2nd Al layer 20, a step for forming the third interlayer insulation film 21, a step for forming the drain wiring layer 23 constituted by the 3rd Al layer, and other steps by the method similar to conventional technique. After the end of these steps, the semiconductor device including the lateral MOSFET illustrated in FIG. 1, and the CMOS including the NchMOSFET and PchMOSFET is completed.

According to the semiconductor device of this embodiment thus configured, the field plate 14 is manufactured simultaneously with formation of the gate electrode 11 in the lateral MOSFET. In this case, the field plate 14 is produced without the need of an additional manufacturing step. Accordingly, the semiconductor device of this embodiment is manufacturable by utilizing a structure similar to the structure of the conventional manufacturing steps.

Second Embodiment

A second embodiment according to the present disclosure will be described. This embodiment is similar to the first embodiment except for the position of the moisture proof film. Accordingly, only points different from the corresponding points in the first embodiment are discussed.

Figure 8:
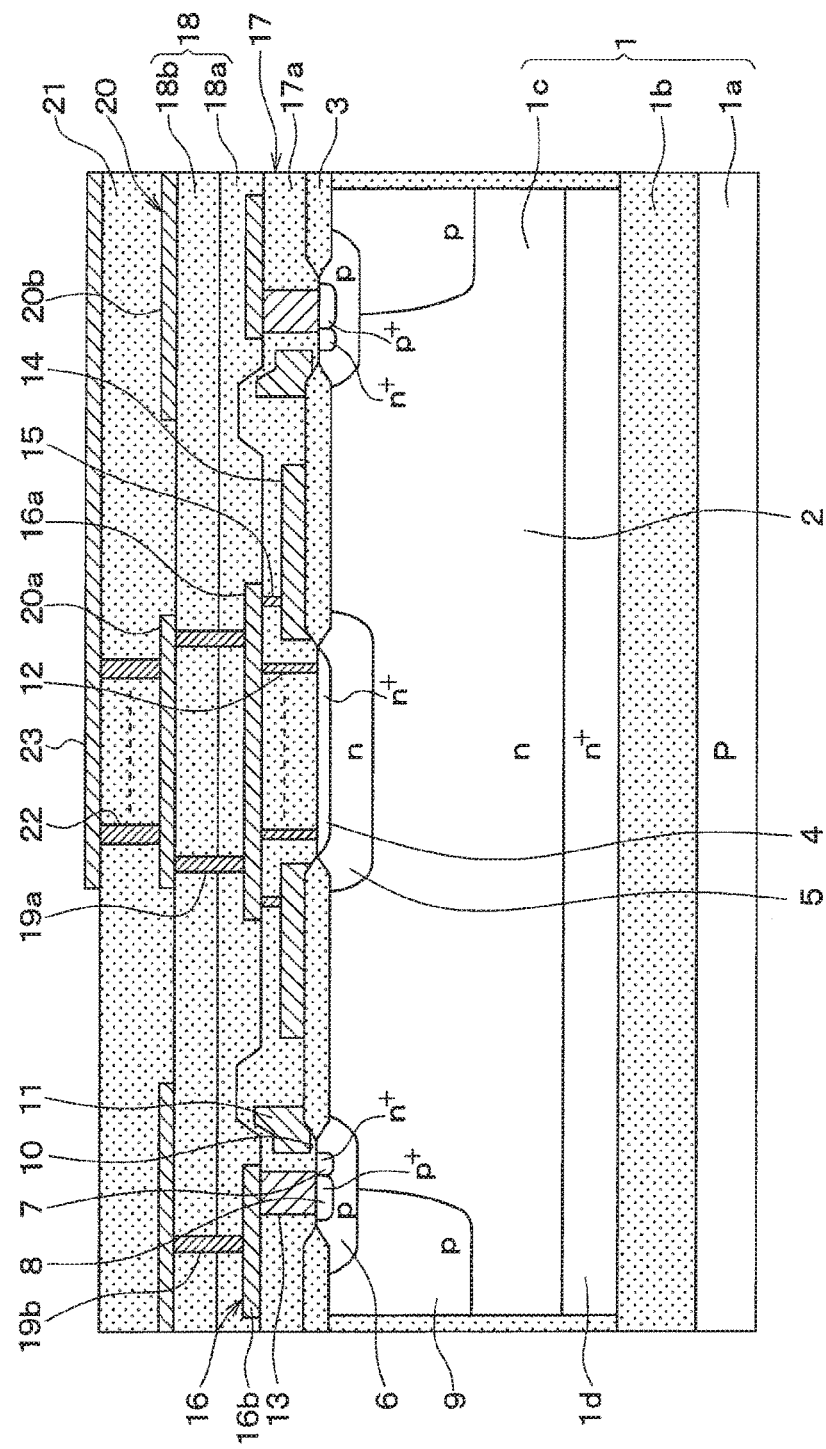
FIG. 8 is a cross-sectional view of a semiconductor device including a lateral MOSFET according to a second embodiment of the present disclosure.

According to this embodiment, the moisture proof film is provided as a part of the second interlayer insulation film 18. Specifically, as illustrated in FIG. 8, the second interlayer insulation film 18 is constituted by a silicon nitride film 18a and a TEOS film 18b. The silicon nitride film 18a is a moisture proof film formed on the surface of the first interlayer insulation film 17 including the surface of the 1st Al layer 16. The TEOS film 18b is formed on the silicon nitride film 18a. As in this structure, the moisture proof film may be provided as a part of the second interlayer insulation film 18.

Figures 9A, 9B, 9C:
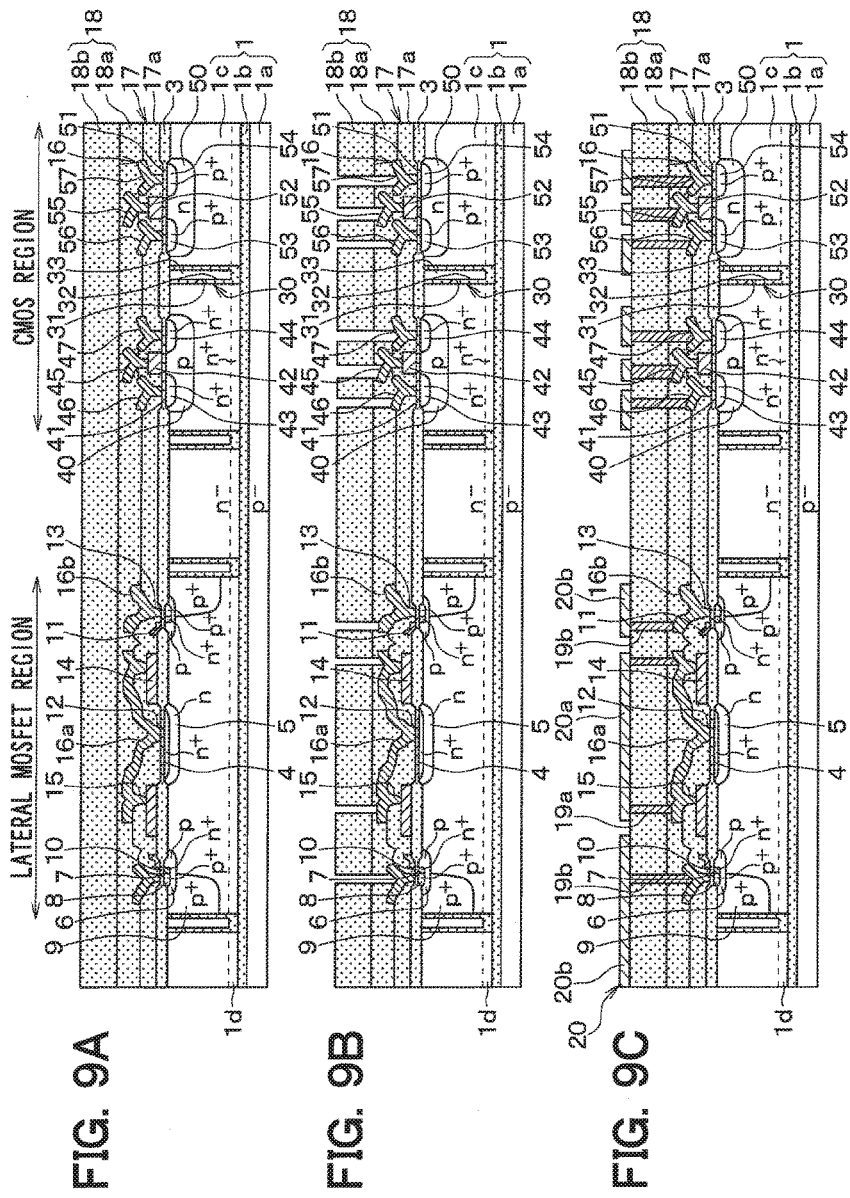
FIGS. 9A to 9C are cross-sectional views illustrating manufacturing steps of the semiconductor device including the lateral MOSFET illustrated in FIG. 8.

The semiconductor device thus configured is manufactured by the steps illustrated in FIGS. 5A to 7D in the first embodiment, and subsequently by steps illustrated in FIGS. 9A to 9C, for example. Specifically, as illustrated in FIG. 9A, the silicon nitride film 18a is formed on the surface of the first interlayer insulation film 17 including the electrodes and wiring patterned by the step illustrated in FIG. 7D, and then the TEOS film 18b is formed on the silicon nitride film 18a. A not-shown mask opened at positions of contact holes is formed, and then the second interlayer insulation film 18 is etched to form the contact holes as illustrated in FIG. 9B. Thereafter, the 2nd Al layer 20 is formed and then patterned. This step forms components such as the drain wiring plugs 19a, the source wiring plugs 19b, the drain wiring layer 20a, and the source wiring layer 20b.

Advantageous effects similar to those of the first embodiment are obtained even in the structure including the moisture proof film provided as a part of the second interlayer insulation film 18. However, it is preferable that the moisture proof film, which is provided to reduce accumulation of charges by moisture entrance, is disposed in the vicinity of the surface of the LOCOS oxide film 3 where a larger amount of charges are accumulated. Accordingly, on-resistance fluctuations more effectively decreases in the structure of the first embodiment which includes the moisture proof film constituted by a part of the first interlayer insulation film 17.

Third Embodiment

A third embodiment according to the present disclosure will be described. This embodiment is similar to the first embodiment except for the position of the moisture proof film. Accordingly, only points different from the corresponding points in the first embodiment are discussed herein.

Figure 10:
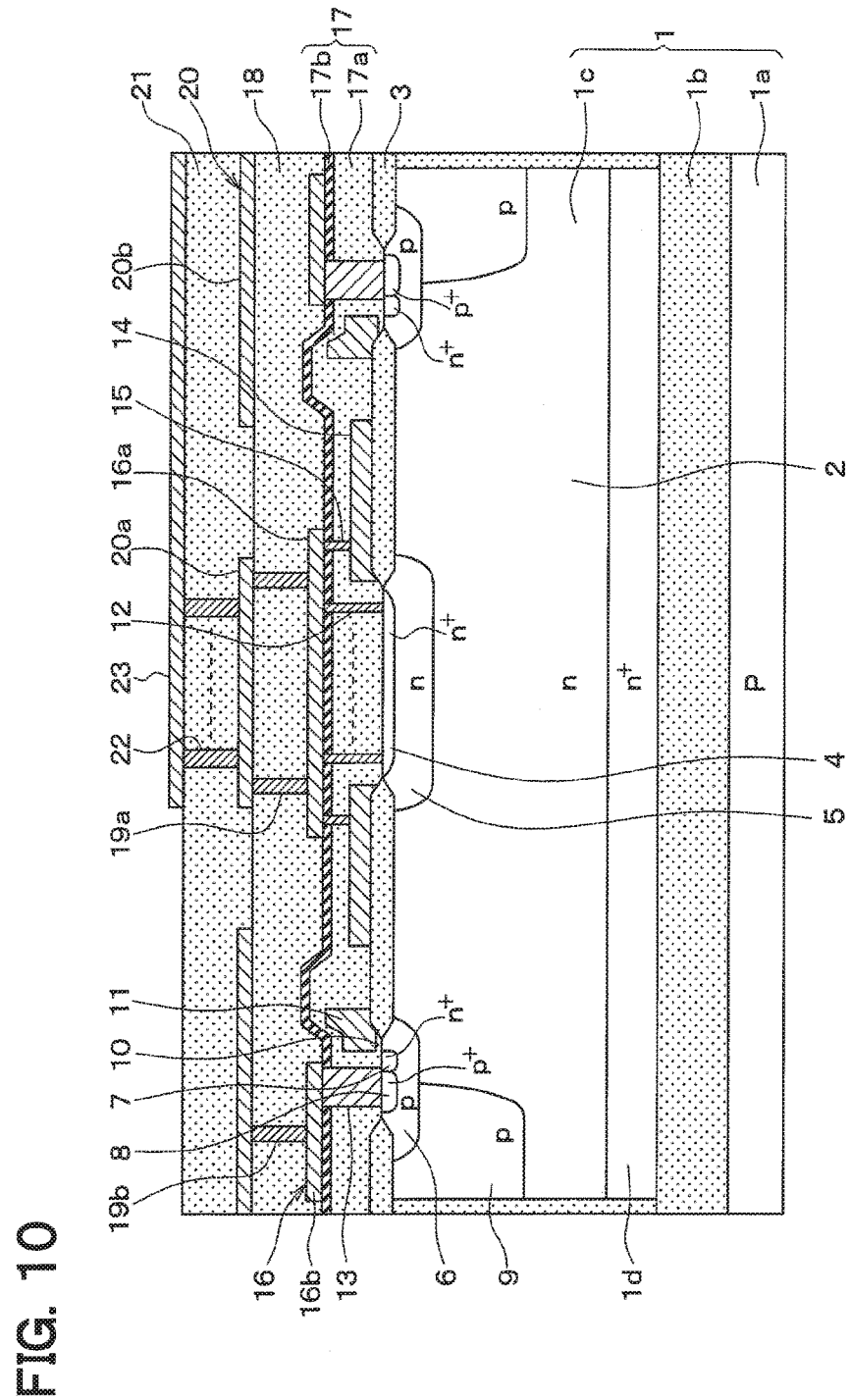
FIG. 10 is a cross-sectional view of a semiconductor device including a lateral MOSFET according to a third embodiment of the present disclosure.
Figure 11:
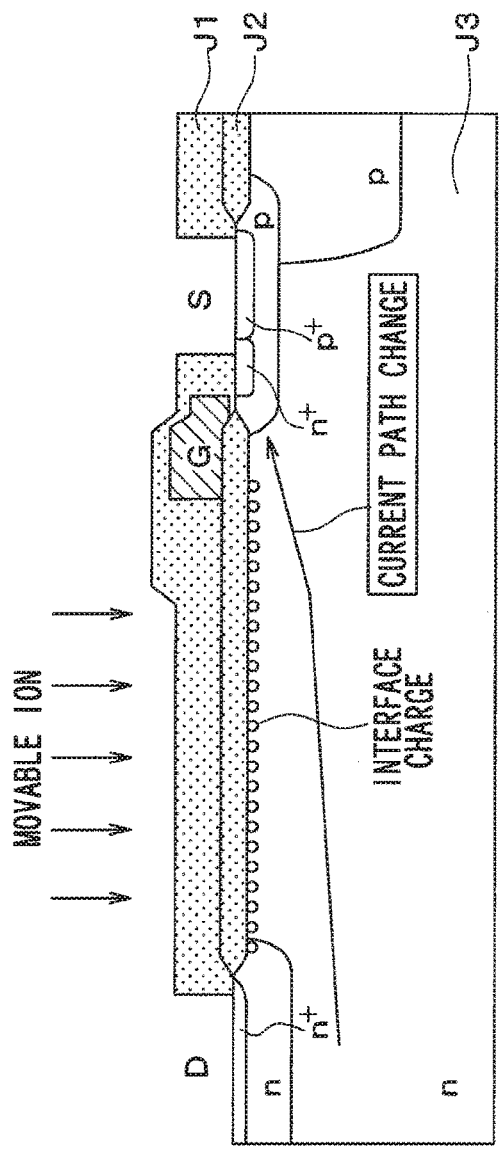
FIG. 11 is a cross-sectional view illustrating an estimated model of a lateral MOSFET used for simulation.

According to this embodiment, a part of the 2nd Al layer 20, specifically, the source wiring layer 20b, is expanded to a region where charges are accumulated, i.e., a position on the LOCOS oxide film 3 between the gate electrode 11 and the field plate 14 as illustrated in FIG. 10. In other words, a part of the 2nd Al layer 20 functioning as a moisture proof film is provided as well as the silicon nitride film 17b. A potential difference is produced between the gate electrode 11 and the drain electrodes 12, and therefore the gate electrode 11 is separated by a predetermined clearance from the field plate 14 electrically connected with the drain electrodes 12. The 2nd Al layer 20 is provided in such a position as to overlap with the region between the gate electrode 11 and the field plate 14 as viewed in the normal direction of the substrate surface.

According to this structure, the 2nd Al layer 20 is expanded to the position on the LOCOS oxide film 3 between the gate electrode 11 and the field plate 14 to function as a moisture proof film. This structure improves the on-resistance fluctuation reduction effect.

OTHER EXAMPLES

While the layout example of the circular lateral MOSFET has been discussed, the shape of the lateral MOSFET is not limited to the circular shape. For example, a layout of linear arrangement of the source and drain may be adopted. Alternatively, the drain side may have an oval shape, while the collector side may have an oval shape surrounding the drain circumference. The structure in which the drain is positioned at the cell center has been discussed, but a structure in which the collector is positioned at the cell center may be adopted. However, it is preferable that the structure in which the drain is positioned at the cell center is adopted for securing a channel width. In both the structures, the foregoing advantageous effects are obtained when the size of the field plate 14 is larger than the size of the gate electrode 11 in the direction of current flow between the drain electrodes 12 corresponding to a first electrode and the source electrode 13 corresponding to a second electrode.

According to the embodiments described herein, entrance of moisture toward the element is avoided by laminating the moisture proof film of the silicon nitride film 17b throughout the surface of the BPSG film 17a. However, on-resistance fluctuations are particularly dependent on accumulation of charges in the region on the LOCOS oxide film 3 between the gate electrode 11 and the field plate 14. Accordingly, the on-resistance fluctuation reduction effect is achievable when a moisture proof film is provided at least on the LOCOS oxide film 3 between the gate electrode 11 and the field plate 14.

However, when the region covered by the moisture proof film is small, moisture may flow around the outer edge of the moisture proof film and enter the element. Accordingly, for further securely preventing entrance of moisture, it is preferable that the moisture proof film is formed throughout the surface of the BPSG film 17a, i.e., the substrate surface except for the contact portions such as electrodes, as in the foregoing embodiments.

The layers of the moisture proof film may be arbitrarily formed as long as at least one layer is provided. According to the third embodiment, for example, both the silicon nitride film 17b and the 2nd Al layer 20 function as the moisture proof film. However, the moisture proof film may be constituted only by the 2nd Al layer 20. Alternatively, a part of the second interlayer insulation film 18 described in the second embodiment and the 2nd Al layer 20 described in the third embodiment may function as the moisture proof film, or all of the first interlayer insulation film 17, the second interlayer insulation film 18, and the 2nd Al layer 20 may function as the moisture proof film. The moisture proof film may be formed at positions other than the positions specified in the foregoing embodiments.

While the steps for forming the impurity layers included in the semiconductor device have been described with reference to FIGS. 5A to 7D by way of example, the order of the manufacturing steps may be switched when appropriate. For example, the order of the steps shown in FIGS. 6B to 6D may be arbitrarily determined, and therefore may be switched to an order different from the order described in the embodiments.

The n channel type lateral MOSFET in which a first conductivity type serves as n type and a second conductivity type serves as p type has been discussed in the embodiment by way of example, but the present disclosure is applicable to a p channel type lateral MOSFET which reverses the conductivity types of the constituent elements. The lateral MOSFET has been discussed by way of example, but the present disclosure is applicable to a lateral IGBT having a similar structure. The lateral IGBT includes an n$^+$ type emitter region constituted by the n$^+$ type source region 7 corresponding to a first conductivity type second impurity layer of the first embodiment, and a second conductivity type p$^+$ type collector region constituted by the n$^+$ type drain region 4 corresponding to a first conductivity type first impurity layer of the first embodiment. Other structures and manufacturing methods of the lateral IGBT are similar to the corresponding structures and methods of the first embodiment.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:
1. A semiconductor device comprising:
a lateral transistor, wherein:
the lateral transistor includes:
a semiconductor substrate including a drift layer having a first conductivity type;

a first impurity layer having the first conductivity type or a second conductivity type and arranged in a surface portion of the drift layer;

a channel layer having the second conductivity type and arranged in another surface portion of the drift layer;

a second impurity layer having the first conductivity type, arranged in a surface portion of the channel layer, and surrounded by the channel layer;

a separation insulation film arranged on the drift layer between the channel layer and the first impurity layer;

a gate insulation film arranged on a surface of a channel region of the channel layer and connected with the separation insulation film, the channel region being arranged in another surface portion of the channel layer sandwiched between the second impurity layer and the drift layer;

a gate electrode arranged on a surface of the gate insulation film and extending from the gate insulation film to the separation insulation film;

a first electrode electrically connected with the first impurity layer;

a second electrode electrically connected with the second impurity layer and the channel layer; and a field plate arranged on the separation insulation film between the gate electrode and the first electrode and electrically connected with the first electrode to be fixed to a potential of the first electrode;

a size of the field plate is larger than a size of the gate electrode in a direction of current flowing between the first electrode and the second electrode.

2. The semiconductor device according to claim 1, wherein:

the field plate, the gate electrode, and the second electrode are arranged to surround a circumference of the first electrode with a center located at the first electrode; and the size of the field plate is larger than the size of the gate electrode in a radial direction around a cell center located at the center of the first electrode.

3. The semiconductor device according to claim 1, wherein:

the lateral transistor further includes a moisture proof film arranged on a portion between the gate electrode and the field plate, the moisture proof film having a moisture proof function for preventing entrance of moisture into the lateral transistor.

4. The semiconductor device according to claim 3, wherein:

the lateral transistor further includes an interlayer insulation film arranged on the first impurity layer, the second impurity layer, the channel layer, the gate electrode, and the separation insulation film; and the interlayer insulation film includes the moisture proof film.

5. The semiconductor device according to claim 4, wherein:

the moisture proof film is a silicon nitride film.

6. The semiconductor device according to claim 3, wherein:

the lateral transistor further includes:

a first interlayer insulation film arranged on the first impurity layer, the second impurity layer, the channel layer, the gate electrode, and the separation insulation film;

a first metal wiring layer arranged on the interlayer insulation film;

a second interlayer insulation film arranged on the first metal wiring layer; and a second metal wiring layer arranged on the second interlayer insulation film; and the moisture proof film is provided by a part of the second metal wiring layer.

7. The semiconductor device according to claim 3, wherein:

the lateral transistor further includes:

a first interlayer insulation film arranged on the first impurity layer, the second impurity layer, the channel layer, the gate electrode, and the separation insulation film;

a first metal wiring layer arranged on the first interlayer insulation film; and a second interlayer insulation film arranged on the first metal wiring layer; and the second interlayer insulation film includes the moisture proof film.

* * * * *